United States Patent
Bazan et al.

(10) Patent No.: US 9,000,423 B2
(45) Date of Patent: Apr. 7, 2015

(54) PROCESSING ADDITIVE FOR SINGLE-COMPONENT SOLUTION PROCESSED ORGANIC FIELD-EFFECT TRANSISTORS

(71) Applicant: The Regents of the University of California, Oakland, CA (US)

(72) Inventors: Guillermo C. Bazan, Goleta, CA (US); Thuc-Quyen Nguyen, Goleta, CA (US); Lei Ying, Goleta, CA (US); Peter Zalar, Thousand Oaks, CA (US); Yuan Zhang, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/869,498

(22) Filed: Apr. 24, 2013

(65) Prior Publication Data

US 2013/0277658 A1    Oct. 24, 2013

Related U.S. Application Data

(60) Provisional application No. 61/637,525, filed on Apr. 24, 2012.

(51) Int. Cl.

| | | |
|---|---|---|
| *H01L 51/30* | (2006.01) | |
| *H01L 31/0256* | (2006.01) | |
| *C08G 73/10* | (2006.01) | |
| *H01L 51/00* | (2006.01) | |
| *H01L 51/05* | (2006.01) | |
| *H01L 51/56* | (2006.01) | |

(52) U.S. Cl.
CPC ........ *H01L 51/0043* (2013.01); *H01L 51/0508* (2013.01); *H01L 51/56* (2013.01)

(58) Field of Classification Search
USPC ............ 257/40, 98, E51.001, E51.025, 257/E51.027; 136/263; 438/99, 158
See application file for complete search history.

(56) References Cited

U.S. PATENT DOCUMENTS

| | | | |
|---|---|---|---|
| 6,994,893 B2 | 2/2006 | Spreitzer et al. | |
| 7,704,785 B2 | 4/2010 | Steiger et al. | |
| 2008/0032441 A1* | 2/2008 | Hirai | 438/99 |
| 2009/0108255 A1 | 4/2009 | Bazan et al. | |
| 2010/0283047 A1* | 11/2010 | Facchetti et al. | 257/40 |
| 2011/0180787 A1 | 7/2011 | Cho et al. | |
| 2012/0227812 A1* | 9/2012 | Quinn et al. | 136/263 |
| 2012/0322966 A1* | 12/2012 | Bazan et al. | 528/33 |

FOREIGN PATENT DOCUMENTS

WO    WO2009058811    5/2009

OTHER PUBLICATIONS

Ji Sun Moon et al., "Effect of Processing Additive on the Nanomorphology of a Bulk Heterojunction Material", Nano Letters, 2010, 10, 4005-4008.

(Continued)

*Primary Examiner* — Dao H Nguyen
(74) *Attorney, Agent, or Firm* — Gates & Cooper LLP

(57) ABSTRACT

Methods and compositions to improve the performance of single-component polymer FETs is provided comprising processing a conjugated polymer in the presence of a processing additive. Also provided is a FET device fabricated with a processing additive. Such devices have increased saturation hole and/or electron mobility compared to a control FETs.

31 Claims, 12 Drawing Sheets

(56) References Cited

OTHER PUBLICATIONS

Corey V. Hoven et al., "Improved Performance of Polymer Bulk Heterojunction Solar Cells Through the Reduction of Phase Separation via Solvent Additives", Adv. Materials, 2010, 22, E63-E66.

James T. Rogers et al., "Structural Order in Bulk Heterojunction Films Prepared with Solvent Additives", Adv. Materials, 2011, 23, 2284-2288.

Smits, E. C. P., et al., "Ambipolar charge transport in organic field-effect transistors", Physical Review B., 2006, 205316-1-205316-9, vol. 73.

Tsao, H.N., et al., "The Influence of Morphology on High-Performance Polymer Field-Effect Transistors", Advanced Materials, 2009, pp. 209-212, vol. 21.

Peet, J., et al., "Efficiency enhancement in low-bandgap polymer solar cells by processing with alkane dithiols", Nature Materials, Jul. 2007, pp. 497-500, vol. 6.

Anthopoulos, T.D., et al., "Air-Stable Complementary-like Circuits Based on Organic Ambipolar Transistors", Advanced Materials, 2006, pp. 1900-1904, vol. 18.

Sirringhaus, H., "Device Physics of Solution-Processed Organic Field-Effect Transistors", Advanced Materials, 2005, pp. 2411-2425, vol. 17.

Sirringhaus, H., et al., "Two-dimensional charge transport in self-organized, high-mobility conjugated polymers", Nature, Oct. 14, 1999, pp. 685-688, vol. 401.

Dibenedetto, S., et al., "Molecular Self-Assembled Monolayers and Multilayers for Organic and Unconventional Inorganic Thin-Film Transistor Applications", Advanced Materials, 2009, pp. 1407-1433, vol. 21.

Yang, Y., et al., "Organic Electronics: From Materials to Devices", Advanced Materials, 2009, pp. 1401-1403, vol. 21.

Huang, F., et al., "Highly Efficient Polymer White-Light-Emitting Diodes Based on Lithium Salts Doped Electron Transporting Layer", Advanced Materials, 2009, pp. 361-365, vol. 21.

Yu, G., et al., "Polymer Photovoltaic Cells: Enhanced Efficiencies via a Network of Internal Donor-Accepted Heterojunctions", Science, Dec. 15, 1995, pp. 1789-1791, vol. 270.

Tsao, H.N., et al., "Ultrahigh Mobility in Polymer Field-Effect Transistors by Design", Journal of the American Chemical Society, 2011, pp. 2605-5612, vol. 133.

Bronstein, H., et al., "Thieno[3,2-b]thiophene—Diketopyrrolopyrrole-Containing Polymers for High-Performance Organic Field-Effect Transistors and Organic Photovoltaic Devices", Journal of the American Chemical Society, 2011, pp. 3272-3275, vol. 133.

\* cited by examiner

PROCESSING ADDITIVE FOR SINGLE-COMPONENT SOLUTION PROCESSED ORGANIC FIELD-EFFECT TRANSISTORS

CROSS-REFERENCE TO RELATED APPLICATIONS

This application claims priority under 35 U.S.C. §119(e) of the following co-pending and commonly-assigned U.S. Provisional patent application:

U.S. Provisional Patent Application Ser. No. 61/637,525, entitled "PROCESSING ADDITIVE FOR SINGLE-COMPONENT SOLUTION PROCESSED ORGANIC FIELD-EFFECT TRANSISTORS," filed on Apr. 24, 2012, by Guillermo C. Bazan, Thuc-Quyen Nguyen, Lei Ying, Peter Zalar, and Yuan Zhang, which application is incorporated by reference herein.

This application is related to U.S. Utility patent application Ser. No. 13/526,371, filed on Jun. 18, 2012, by G. Bazan, L. Ying, B. Hsu, W. Wen, H-R Tseng, and G. Welch entitled "REGIOREGULAR PYRIDAL[2,1,3]THIADIAZOLE PI-CONJUGATED COPOLYMERS FOR ORGANIC SEMICONDUCTORS", which application claims priority under 35 U.S.C. §119(e) to U.S. Provisional Patent Application Ser. No. 61/498,390, filed on Jun. 17, 2011, by G. Bazan, L. Ying, B. Hsu, and G. Welch entitled "REGIOREGULAR CONSTRUCTIONS FOR THE SYNTHESIS OF THIADIAZOLO (3,4) PYRIDINE CONTAINING NARROW BAND GAP CONJUGATED POLYMERS" and U.S. Provisional Patent Application Ser. No. 61/645,970, filed on May 11, 2012, by G. Bazan, L. Ying, and Wen Wen, entitled "REGIOREGULAR PYRIDAL[2,1,3]THIADIAZOLE PI-CONJUGATED COPOLYMERS FOR ORGANIC SEMICONDUCTORS";

This application is related to U.S. Utility patent application Serial No. Utility patent application Ser. No. 12/257,069, filed Oct. 23, 2008, by G. Bazan et. al., entitled "PROCESSING ADDITIVES FOR FABRICATING ORGANIC PHOTOVOLAIC CELLS," which application claims priority under 35 U.S.C. §119(e) of U.S. Provisional Patent Application No. 60/984,229, filed Oct. 31, 2007;

all of which applications are incorporated by reference herein.

BACKGROUND OF THE INVENTION

1. Field of the Invention

The invention relates to field-effect transistors, and more particularly, the use of additives to increase the performance of single-component polymer field-effect transistors.

2. Description of the Related Art (Note: This application references a number of different publications as indicated throughout the specification by one or more reference numbers as superscripts [x]. A list of these different publications ordered according to these reference numbers can be found below in the section entitled "References." Each of these publications is incorporated by reference herein.)

Recently, solution processed polymer field-effect transistors (FETs) have been shown to give saturation mobilities in the order of $10^{-1}$-$10^{0}$ cm$^2$/Vs[1]. These mobilities make polymer field-effect transistor systems competitive with amorphous silicon, and may allow for the fabrication of high speed CMOS circuitry [2]. Processing of organic bulk heterojunction solar cells (BHJ-OSCs) with the addition of a small percent of processing additives has become a widespread method for helping to improve the overall performance of devices [3]. It has been postulated that addition of these processing additives helps to improve bulk organization in the bulk heterojunction, leading to a significant increase in all device properties such as fill factor, open-circuit voltage, and short-circuit current.

For organic FETs, the active layer-gate dielectric interface plays the biggest role in determining the overall device characteristics since the conduction pathway lays in a zone only several nanometers adjacent to the active layer-dielectric interface [4]. For solution-processed organic FETs, processing conditions can significantly influence the organization of individual molecules or polymer chains on the gate dielectric[5]. Until now, choice of gate dielectric (i.e. polymer dielectric or silicon dioxide $SiO_2$), gate dielectric passivation (i.e. hexamethyldisilazane or octytrichlorosilane treatment), solvent choice, and post-processing annealing are the techniques which are currently available to help optimize a given material's performance.

SUMMARY OF THE INVENTION

A method to improve the performance of organic electronic or optoelectronic devices (e.g., transistors, single-component polymer FETs, OPVs and OLEDs) is provided, comprising processing a conjugated polymer in the presence of a processing additive.

In one or more embodiments, a method of fabricating an organic device is provided, comprising processing a single component conjugated polymer, in a presence of a processing additive and onto a substrate, wherein the single component conjugated polymer processed onto the substrate is fabricated into an active region of an organic device on the substrate; and the single component conjugated polymer comprises a donor and an acceptor.

In one embodiment, the processing comprises adding the processing additive to a solution in which the conjugated polymer is dissolved, wherein the conjugated polymer is dissolved in a solvent to form the solution.

In one embodiment, the processing further comprises: depositing the solution, after the additive is added, onto a dielectric layer on a substrate, wherein the solution forms a film on the dielectric layer on the substrate; and annealing the film; and further comprising fabricating the film comprising the composition into the active region or channel region of the transistor or FET.

In one embodiment, the single component conjugated polymer is a single type of polymer processed in a single solvent.

In an embodiment, the conjugated polymer has band gap between 1.7-0.5 eV.

In an embodiment, the conjugated polymer has a band gap less than 1.7 electron volts (eV).

In another embodiment, the saturation mobility (e.g., hole saturation mobility) and/or carrier (electron and/or hole) mobility of the FET is increased compared to a control FET or transistor where the conjugated polymer is processed without the additive.

In an embodiment the hole mobility in the saturation regime of the FET (hole saturation mobility) is increased by a factor of least 6 as compared to the control FET's saturation hole mobility of no less than $1.3 \times 10^{-4}$ cm$^2$/Vs.

In an embodiment, the hole mobility is increased by a factor of at least 1.7 from the control FET's hole mobility of no less than $2.3 \times 10^{-1}$ cm$^2$/Vs.

In an embodiment, an output current in a saturation regime is increased by a factor of at least 1.6, compared to a control FET having an output current in the saturation regime of no less than 22 microamps where the conjugated polymer is processed without the additive.

In an embodiment, an on/off (Ion/Ioff) ratio is increased by a factor of at least ten compared to a control FET's on/off ratio of no less than $10^4$ where the conjugated polymer is processed without the additive.

In another embodiment, the lifetime of the FET or device is increased compared to a control FET/device where the conjugated polymer is processed without the additive In an embodiment, a threshold voltage magnitude is reduced, compared to a control FET's threshold voltage magnitude of no more than 30 Volts where the conjugated polymer is processed without the additive.

In one embodiment, the processed conjugated polymer comprises a composition having a surface roughness in the active/channel region increased by a factor of at least two as compared to a surface roughness of no more than 0.55 nanometers over an area of 5 micrometers by 5 micrometers in a control active/channel region comprising the conjugated polymer processed without the additive.

In an embodiment, the processing additive has a higher boiling point that the solvent used, and/or the conjugated polymer has a lower solubility in the processing additive than in the solvent.

In an embodiment, the amount of processing additive is between 0.01% to 10% weight (wt) of additive/wt of solvent. Those of ordinary skill will understand this means the additive can have a weight of 0.01%-10% of the weight of the solvent.

In an embodiment, the conjugated polymer is poly(4-(4,4-bis(2-ethylhexyl)-4H-silolo[3,2-b:4,5-b']dithiophen-2-yl)-[1,2,5]thiadiazolo[3,4-c]pyridine) (SDT-PT-EH), poly(4-(4,4-dihexadecyl-4H-cyclopenta[1,2-b:5,4-b']dithiophen-2-yl)-[1,2,5]thiadiazolo[3,4-c]pyridine) (CDT-PT), or one of the conjugated polymers illustrated in FIG. 2(b).

In an embodiment, the processing additive is selected from diiodooctane; chloronaphthalene, octanedithiol, 1,6-dithiolhexane; 1,6-dichlorohexane; 1,6-dibromohexane; 1,6-diiodohexane; octadinitrile; 1,8-dithioloctane; 1,8-dichlorooctane; 1,8-dibromooctane; 1,8-diiodooctane, decanedinitrile; 1,10-dithioldecane; 1,8-dichlorodecane; 1,8-dibromodecane; 1,8-diiododecane; dodecanedinitrile; or chloronaphthalene.

A composition is provided comprising a processing additive and a conjugated polymer used for a FET, transistor, or device. For example, the composition has improved performance (e.g., mobility), as a channel region/active region of an FET, transistor, or device compared to the conjugated polymer processed without the additive.

In an embodiment, the composition comprises a processing additive and a single component conjugated polymer, wherein the composition has improved performance, as an active region of an organic device, compared to the conjugated polymer processed without the additive, and wherein the single component conjugated polymer comprises a donor and an acceptor.

In an embodiment of the composition, the amount of processing additive is between 0.01% to 10% wt of additive/wt of solvent.

A FET, transistor, or device is provided comprising a conjugated polymer processed using a processing additive.

In an embodiment, the device is an organic device, comprising an active region including a single component conjugated polymer processed using a processing additive and wherein the single component conjugated polymer comprises a donor and an acceptor.

The FET or transistor can comprise a channel/active region including the conjugated polymer processed using the processing additive. The FET can be a solution processed FET having a hole mobility in the channel region in the saturation regime (saturation hole mobility) increased by a factor of at least 6 as compared to the control FET's saturation hole mobility of no less than $1.3 \times 10^{-4}$ cm$^2$/Vs where the conjugated polymer is processed without the additive; and a hole mobility increased by a factor of at least 1.7 compared to the control FET's hole mobility of no less than $2.3 \times 10^{-1}$ cm$^2$/Vs where the conjugated polymer is processed without the additive.

BRIEF DESCRIPTION OF THE DRAWINGS

For a more complete understanding of the present invention, reference is now made to the following descriptions taken in conjunction with the accompanying drawings, in which like reference numbers represents corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

For a polymer system, additives were found to increase device operation significantly. In one case, the field-effect mobility in the saturation regime could be improved up to 2 times (2×) when compared to the device processed from a single solvent. Further studies demonstrated this effect on another polymer system, whereby the mobility was increased up to 6.7× when compared to the control device.

The disclosed polymer system additives can help improve the performance of existing polymeric systems/conjugated polymers for organic field-effect transistors without the need to develop new polymers or optimize said polymers. This is attractive from the perspective of reducing research and development costs as well as infrastructure tooling costs.

Figure 1:
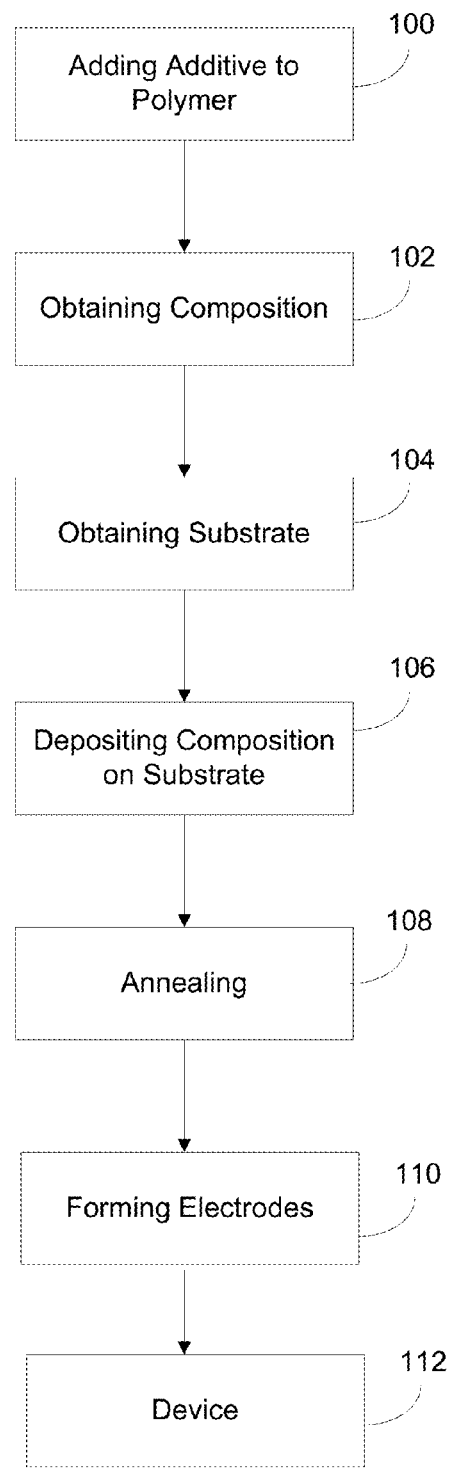
FIG. 1 is a flowchart illustrating a method of fabricating an organic device, according to one or more embodiments of the invention.

FIG. 1 illustrates a method of fabricating an organic electronic or optoelectronic device, e.g., improving the performance of a single component conjugated polymer in a FET, transistor, solar cell, or light emitting diode. The method includes processing (e.g., casting or depositing) the conjugated polymer in the presence of a processing additive, onto a substrate, for example. The processing can include the following steps.

Block 100 represents selecting and/or adding or combining a processing additive to a conjugated polymer (wherein the conjugated polymer is typically selected for use as the channel/active region or film of the FET/device) to obtain a composition 102. The step can comprise adding the processing additive to a solution in which the conjugated polymer is dissolved, wherein the conjugated polymer is dissolved in a solvent to form the solution. The amount and type of processing additive, and/or the type of conjugated polymer, can be selected based on the desired enhancement of device performance.

In one or more embodiments, the polymer can be a copolymer having both donor and acceptor units and/or can be ambipolar. U.S. Utility patent application Ser. No. 13/526, 371, which is incorporated by reference herein, reports on both hole and electron mobility for copolymer CDT-PT. It is reasonable to expect that the methodology of the present invention can be extended to device configurations and polymers that exhibit ambipolarity.

The single component polymer can be a solution composed of a single polymer, rather than a blend of polymers or polymers and non-volatile small molecules. The single component conjugated polymer can be a donor and an acceptor. The conjugated polymer can comprise a donor-acceptor conjugated polymer including a plurality of donor repeating units and a plurality of acceptor repeating units.

The active/channel region can be pristine film or a film processed using a single component conjugated polymer (or single type of polymer) processed in a single solvent.

Block 104 represents obtaining a substrate or substrate with device layers/electrodes deposited on the substrate, e.g., with a gate G and dielectric layer on the substrate (for a transistor), or with a p-type interface/transport layer on a transparent conductive layer on the substrate (OPV or OLED).

Block 106 represents depositing or coating the composition 102 on the substrate. The step can comprise depositing the solution, after the additive is added, onto the dielectric layer on the substrate, wherein the solution forms a film on the dielectric layer on the substrate.

Block 108 represents annealing or drying the film/composition 102.

Block 110 represents forming electrodes and otherwise fabricating the film comprising the processed conjugated polymer into a channel/active region. The step can comprise depositing source and drain electrodes (for a transistor), or depositing metal electrode(s)/contact(s) (OPV), or depositing an n-type interface/transport layer and metal contact (OLED).

Block 112 represents the end result of the method, the film/processed conjugated polymer composition made or fabricated into a channel region/active region of a device such an FET, transistor, organic solar cell, organic photovoltaic cell, or organic light emitting diode.

In one or more embodiments, the processing onto the substrate forms a mixture of the polymer and additive, wherein the additive may evaporate after the solvent and modify the film morphology. Processing additives may be used in very small amounts (such as less than 5%, 3% or 1% of the amount of solvent) and can enhance/improve/alter structure or properties (e.g., morphology, mobility, lifetime) of a film comprising the polymer (see Results and Discussion section).

In one or more embodiments, the amount and type of processing additive, and/or the type of conjugated polymer is selected based on the desired enhancement of device performance.

One or more embodiments of the invention can adapt processing techniques and compounds described in U.S. Patent Publication No. 2009/0108255, by Bazan et. al., corresponding to U.S. Utility patent application Ser. No. 12/257,069, filed Oct. 23, 2008 listed in the cross-reference to related applications section, which publication and application is incorporated by reference herein. For example, one or more embodiments of the processing additive can include one or more of the processing additive compounds or processing additive organic compounds described in U.S. Patent Publication No. 2009/0108255 and U.S. Utility patent application Ser. No. 12/257,069.

In some embodiments, the method of FIG. 1 can be a liquid-based coating process comprising mixing (Block 100) the organic active region materials and a processing additive with a solvent (e.g., an organic solvent) to form a solution or a dispersion or suspension, coating the solution or dispersion on a substrate or surface (Block 106), and drying (Block 108) the coated solution or dispersion or suspension. The processing additive can be removed during the drying of the coated solution. However, in some embodiments, at least some of the processing additive remains in the active region after the drying is complete.

The composition comprising the processing additive and a single component conjugated polymer, can have improved performance, as an active region of an organic device, compared to the conjugated polymer processed without the additive, and wherein the single component conjugated polymer comprises a donor and an acceptor.

In one embodiment, the processed single component conjugated polymer can be composition that comprises crystallites or have improved crystallinity and/or π-π stacking as compared to the single component conjugated polymer processed without the additive.

Figure 6:
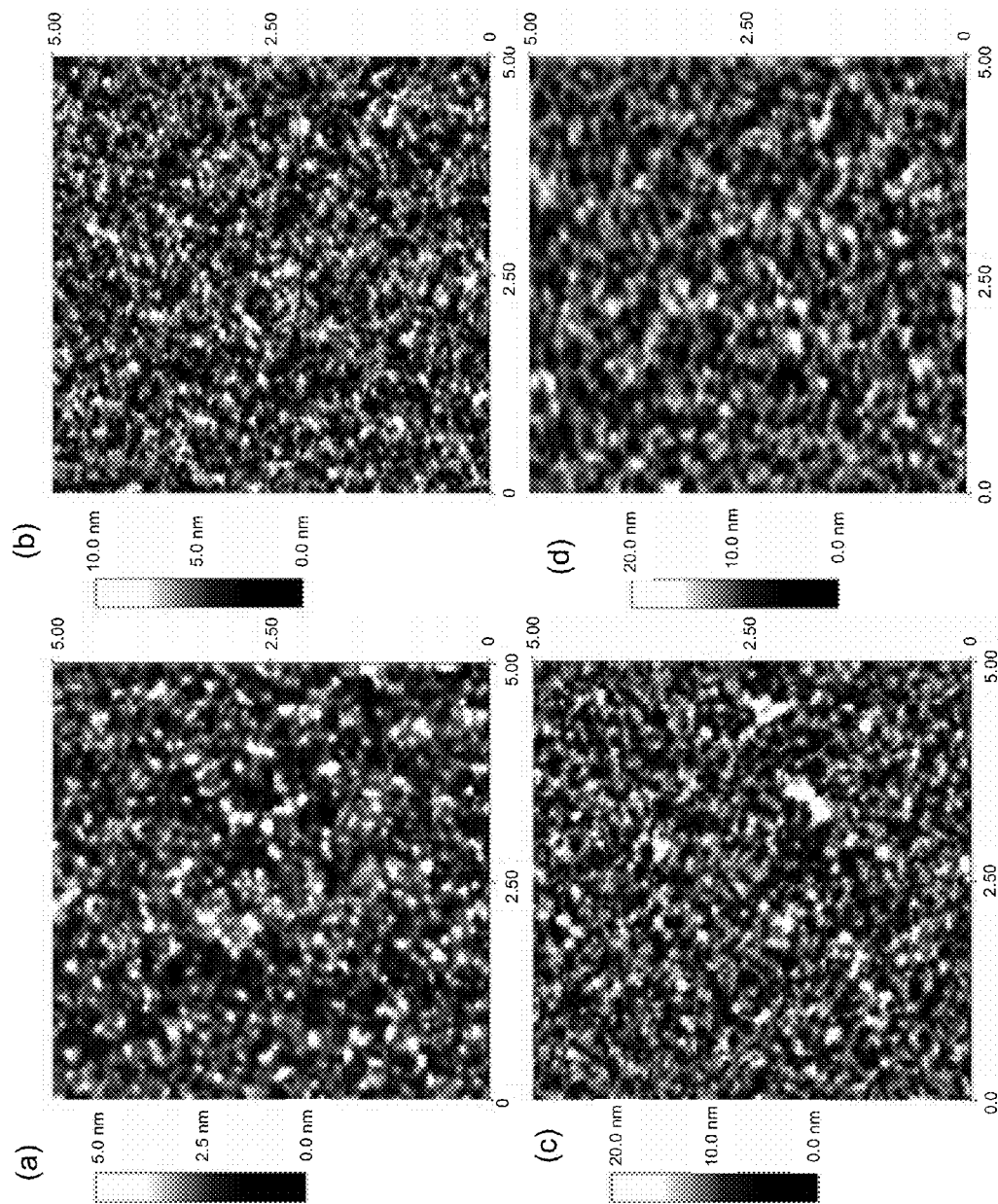
FIG. 6 shows a 5×5 μm images showing the surface topology of SDT-PT-EH devices processed from no additives (a), 1% CN (b), 1% DIO (c), and 1% ODT (d) atop OTS-8 treated SiO$_2$ substrates, wherein the images were taken in the space between the source and drain electrodes.

The processed conjugated polymer can comprise a composition having a surface roughness in the channel/active region increased by a factor of at least two as compared to a surface roughness of no more than 0.55 nanometers over an area of 5 micrometers by 5 micrometers in a control channel/active region comprising the conjugated polymer processed without the additive (see e.g., FIG. 6).

Figure 2A:
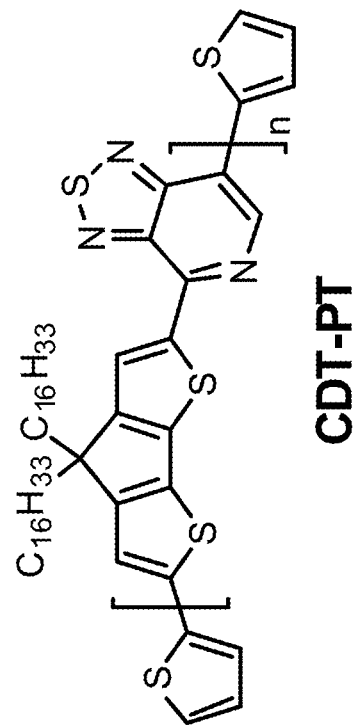
FIG. 2(a) illustrates the molecular structure of two polymers SDT-PT-EH and CDT-PT that can be processed in the presence of an additive, according to one or more embodiments of the invention.
Figure 2A:
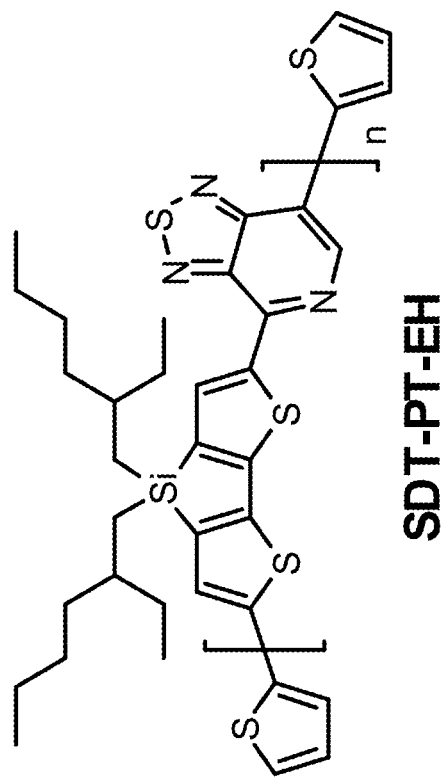

In this work, we report that the addition of processing additives that have seen extensive[3] use in two-component Bulk Heterojunction Organic Solar Cells (BHJ-OSCs) can also help to improve the performance of single-component polymer FETs. Two different materials, as the conjugated polymer in Block 100 of FIG. 1, were used to verify the effect, namely the regioregular polymers poly(4-(4,4-bis(2-ethylhexyl)-4H-silolo[3,2-b:4,5-b']dithiophen-2-yl)-[1,2,5]thiadiazolo[3,4-c]pyridine) (SDT-PT-EH) and poly(4-(4,4-dihexadecyl-4H-cyclopenta[1,2-b:5,4-b']dithiophen-2-yl)-[1,2,5]thiadiazolo[3,4-c]pyridine) (CDT-PT). The molecular structure of the two polymers SDT-PT-EH and CDT-PT are illustrated in FIG. 2(a). Those of skill in the art understand that isomers of the structures in FIG. 2(a) could be included.

In both polymer systems, the output current and saturation mobility of bottom-gate, top contact devices can be improved. For example, a lifetime, a carrier mobility, or both the lifetime and the carrier (e.g., electron and or hole) mobility of the FET fabricated in Block 112 can be increased compared to a control FET where the conjugated polymer is processed without the additive. For example, the hole mobility in a saturation regime (saturation hole mobility) of the FET in Block 112 can be increased by a factor of least 6 as compared to the control FET's saturation hole mobility of no less than $1.3 \times 10^{-4}$ cm$^2$/Vs. For example, the hole mobility can be increased by a factor of at least 1.7 as compared to the control FET's hole mobility of no less than $2.3 \times 10^{-1}$ cm$^2$/Vs.

Figure 8:
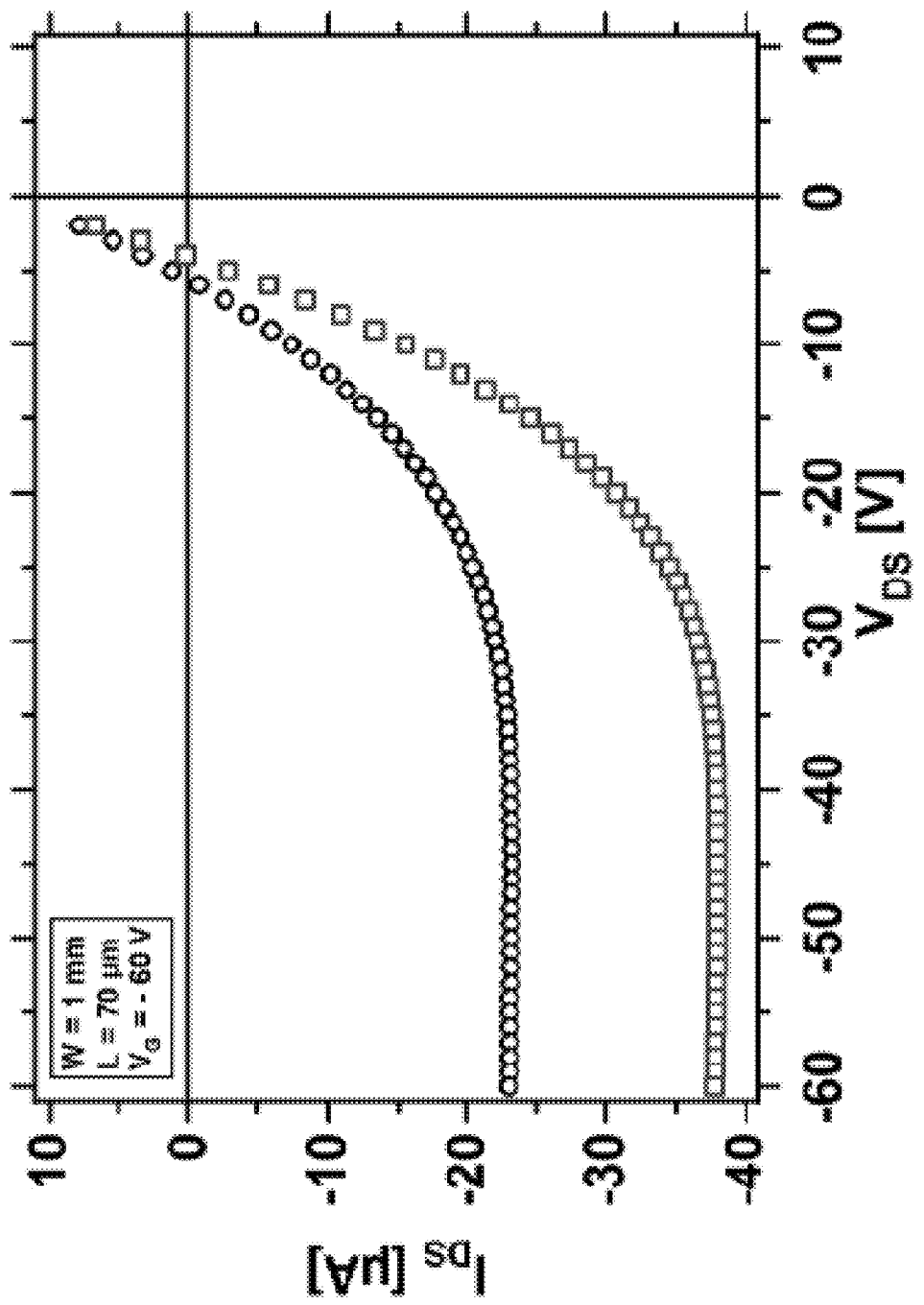
FIG. 8 shows P-type mode output characteristics of CDT-PT devices processed without additive (circles) and with 0.5% v/v DIO (squares), plotting $I_{ds}$ in microamps (μA) as a function of drain source voltage $V_{DS}$ in volts (V), and the transistors have channel width W=1 millimeter (mm), channel length L=70 micrometers (μm) and the gate voltage $V_G$=−60 volts.

For example, an output current in a saturation regime of the FET fabricated in Block 112 can be increased by a factor of at least 1.6, compared to a control FET having an output current in the saturation regime of no less than 22 microamps where the conjugated polymer is processed without the additive (see e.g., FIG. 8). For example, an on/off (Ion/Ioff) ratio can be increased by a factor of at least ten compared to a control FET's on/off ratio of no less than $10^4$ where the conjugated polymer is processed without the additive.

For example, a threshold voltage magnitude of the FET fabricated in Block 112 can be reduced, compared to a control FET's threshold voltage magnitude of no more than 30 Volts where the conjugated polymer is processed without the additive.

Figure 2B:
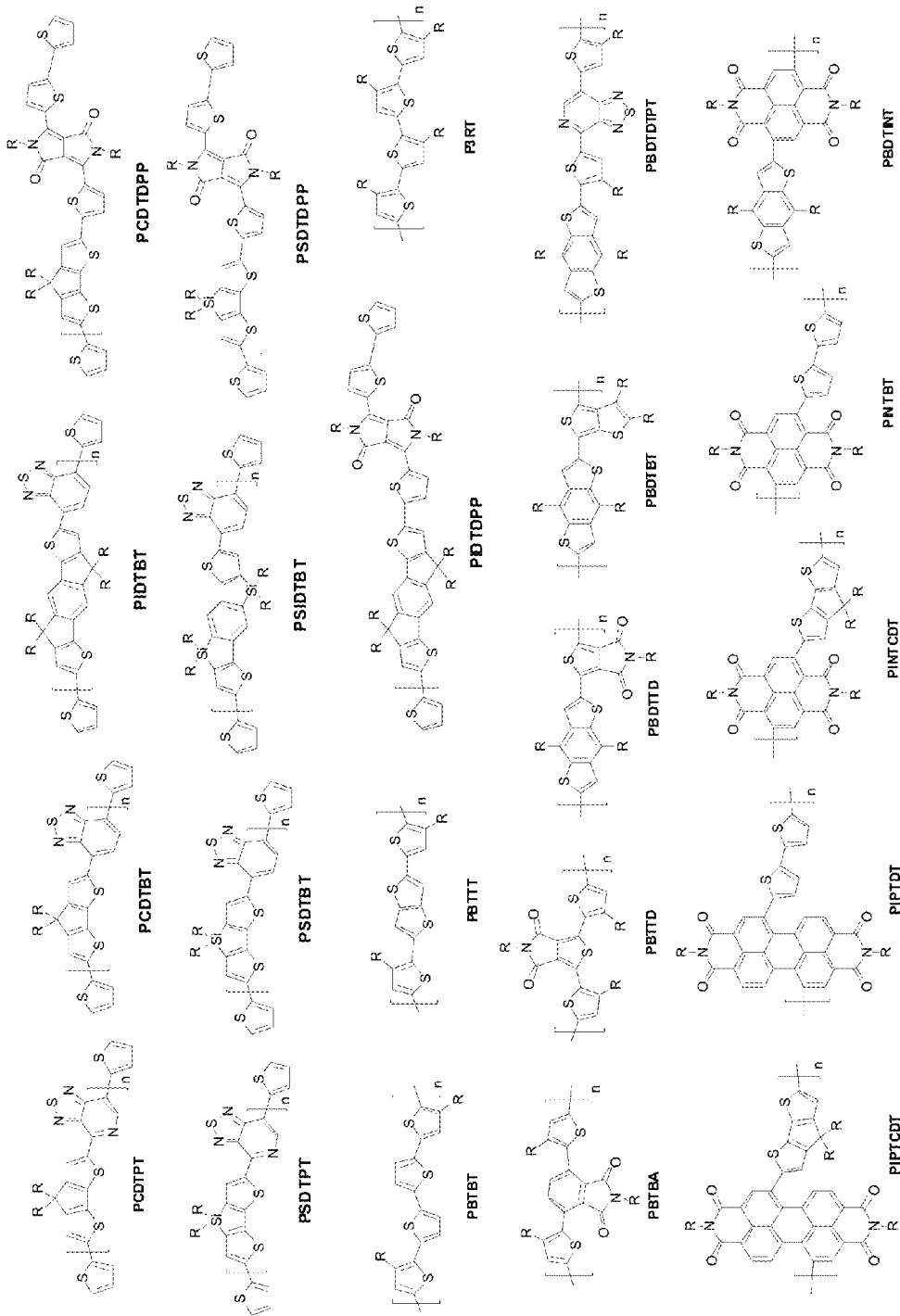
FIG. 2(b) illustrates other conjugated polymers that can be processed in the presence of an additive, according to one or more embodiments of the invention.

Other possible conjugated polymers that can be used with these additives, other than SDT-PT-EH and CDT-PT, include, but are not limited to the conjugated polymers illustrated in FIG. 2(b). Those of skill in the art understand that isomers of the structures in FIG. 2(b) could be included.

In one embodiment, the conjugated polymer has a band gap between 1.7-0.5 electron volts (eV). In another embodiment, the conjugated polymer does not have a band gap greater than 1.7-0.5 eV.

In another embodiment, any conventional conjugated polymers used in conventional FET devices can be processed with processing additives using the disclosed method.

In yet another embodiment, it is possible to use any conjugated polymer that will later be shown to have applicability in FET devices with processing additives using the disclosed method.

The concentration of the conjugated polymer in the solution can be readily adjusted, for example, from 0.01 wt % to 50 wt %. Those of ordinary skill in the art will understand this means the concentration of the conjugated polymer can be adjusted such that the weight of the conjugated polymer can be 0.01% to 50% of the weight of the solution.

When a solvent or solvents are used to dissolve the conjugated polymer and make the solution, the solvent or solvents can be selected from, but are not limited to, the following: methylene chloride, chloroform, cyclohexane, ethanol, isopropanol, toluene, chlorobenzene, o-dichlorobenzene, trichlorobenzene, xylene, mesitylene, ethylbenzene, anisole, ethylbenzene, ethylbenzoate, tetralin, methyl ethyl ketone.

Other processing additives that can be used other than diiodooctane; chloronaphthalene, and octanedithiol include, but not limited to the following:

1,6-dithiolhexane; 1,6-dichlorohexane; 1,6-dibromohexane; 1,6-diiodohexane; octadinitrile; 1,8-dithioloctane; 1,8-dichlorooctane; 1,8-dibromooctane; 1,8-diiodooctane, decanedinitrile; 1,10-dithioldecane; 1,8-dichlorodecane; 1,8-dibromodecane; 1,8-diiododecane; dodecanedinitrile; chloronaphthalene.

In another embodiment, the disclosed process can use other described processing additives [6,7].

In another embodiment, the processing additive has a higher boiling point than the solvent or solvents used to dissolve the conjugated polymer.

In another embodiment, the conjugated polymer has a lower solubility in the processing additive than in the solvent or solvents used.

In one embodiment the amount or concentration of processing additive used can be between 0.01% to 10% wt of additive/wt of solvent; most preferably, 0.1%-5%.

The solution coating processing can be selected from, but not limited to the following: spin coating, ink jet printing, blade coating, dip coating, spraying coating, slot coating, gravure coating or bar coating.

In one embodiment, annealing process is applied to achieve the final Organic Thin Film Transistor (OTFT) device.

Experimental Details

Fabrication of Polymer FETs

Figure 3:
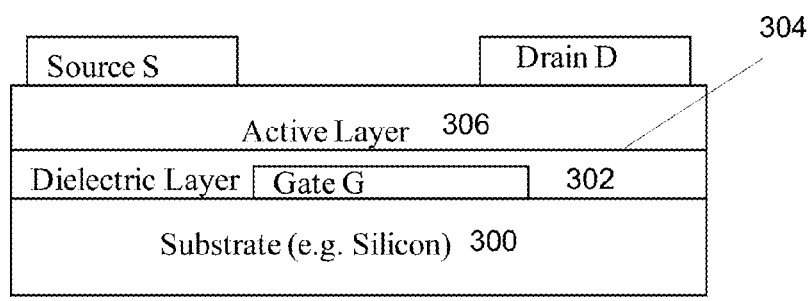
FIG. 3 is a cross-sectional schematic of an FET, according to one or more embodiments of the invention.

Two regioregular copolymers SDT-PT-EH (Mn=38 KDa, PDI=2.6), and CDT-PT (Mn=28 KDa, PDI=1.9) were synthesized in our lab according to the known procedures (see U.S. Provisional Patent Application Ser. No. 61/498,390 and U.S. patent application Ser. No. 13/526,371, which applications are incorporated by reference herein). FETs were made using the process illustrated in FIG. 1 to obtain a bottom-gate, top contact structure, as illustrated in FIG. 3.

The gate electrode G was n$^{++}$ doped Si with 150 nm of SiO$_2$ serving as the gate dielectric 302. The SiO$_2$ dielectric 302 was passivated by treating with octyltrichlorosilane (OTS-8) to minimize trapping at the polymer-dielectric interface 304 and to change the surface energy of the polymer-dielectric interface 304. Accordingly, a substrate 300 and a gate G on the substrate 300 are obtained, as illustrated in Block 104 of FIG. 1.

0.25% weight/volume (w/v) solutions of SDT-PT-EH or CDT-PT were prepared in chlorobenzene (CB) solution (which means a solution equivalent to or having a concentration equivalent to 0.25 grams of SDT-PT-EH or CDT-PT dissolved in 100 mL of the CB solution, or for the experiments done on a smaller scale, this corresponds to 2.5 milligrams/milliliter or 2.5 mg/mL) and the necessary volume: volume v:v ratio of the desired processing additive was added, as illustrated in Block 100 of FIG. 1. These solutions were kept at 80° C. prior to use. All solutions were spin cast onto the OTS-8 treated $SiO_2$ substrates 300 at 2000 rpm for 60 seconds, as illustrated in Block 106 of FIG. 1. After spin-coating, all films were annealed at 80 degrees Celsius (° C.) for 10 minutes, as illustrated in Block 108 of FIG. 1. In one embodiment, the annealing can be performed between 80-350° C. or between 80-400° C. In another embodiment, the annealing 108 can be performed between 80-400° C. under a vacuum.

60 nm thick Au (SDT-PT-EH systems) or Ag (CDT-PT systems) source S and drain D electrodes were subsequently thermally deposited atop the polymer film 306, as illustrated in Block 110 of FIG. 1. The source-drain electrodes were either 1 mm or 2 mm wide and the channel length was 70 µm.

Accordingly, an FET device is formed, as illustrated in Block 112 of FIG. 1 and in FIG. 3, comprising an active or channel region 306 including a processed conjugated polymer processed using a processing additive. Although the above process describes a bottom-gate, top contact structure FET, other transistor or FET structures can be fabricated, such as bottom gate and bottom contact, top gate and bottom contact, and top gate and top contact FETs. The FET typically comprises the processed conjugated polymer 306 on, above, or overlying the substrate 300, source S and drain D electrodes making ohmic contact to the processed polymer-additive composition 306, and the FET's gate G positioned to control, via the field effect, the flow of electrons/holes or current through the polymer-additive composition 306 and between the source S and Drain D. A dielectric layer 302 typically separates the gate G from the active/channel region 306, so that the gate is in electric field contact with the conjugated polymer-additive composition 306 via the dielectric layer 302.

The mobility in the saturation regime was calculated by fitting the following equation to the transfer characteristics of the FETs:

$$\mu_{sat}(V_g) = \frac{\partial I_{ds,sat}}{\partial V_g} \frac{L}{WC_i} \frac{1}{V_g - V_{Th}} \quad \text{(Equation 1)}$$

where $I_{ds}$ is the drain-source current in the saturation regime, $V_g$ is the gate voltage, L is the channel length, W is the channel width, $C_i$ is the capacitance of the dielectric, and $V_{Th}$ is the threshold voltage.

Figure 4:
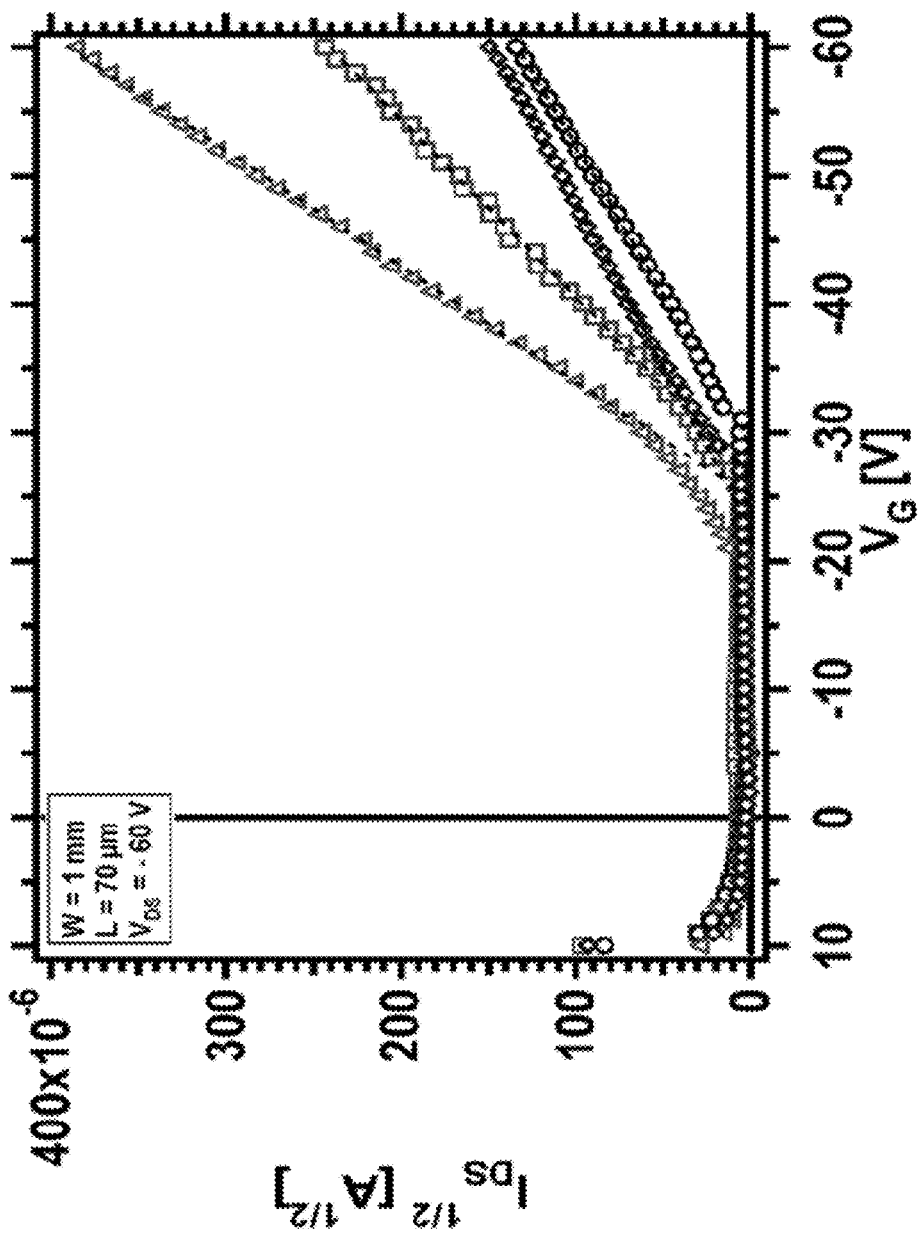
FIG. 4 shows the transfer characteristics of SDT-PT-EH transistors, in the p-type operation regime, that were processed using no additives (circles), 1% volume/volume v/v DIO (triangles), 1% v/v ODT (diamonds), and 1% v/v CN (squares), wherein dotted lines are fits of Equation 1 to the experimental data, the square root of the drain source current $I_{ds}$ in Amps$^{1/2}$ (A$^{1/2}$) is plotted as a function of gate voltage $V_G$ in volts (V), the transistors have channel width W=1 millimeter (mm), channel length L=70 micrometers (μm) and drain source voltage $V_{DS}$=−60 volts, and 1% v/v of additive means the volume of the additive in solution is 1% of the volume of the solution and the volume of the solvent dissolving the conjugated polymer in the solution is 99% of the volume of the solution (to clarify, for 1% additive, the solvent that dissolves the conjugated polymer is composed of 1/100 additive and 99/100 primary solvent, i.e., 1 milliliter (mL) additive and 99 mL solvent).
Figure 5:
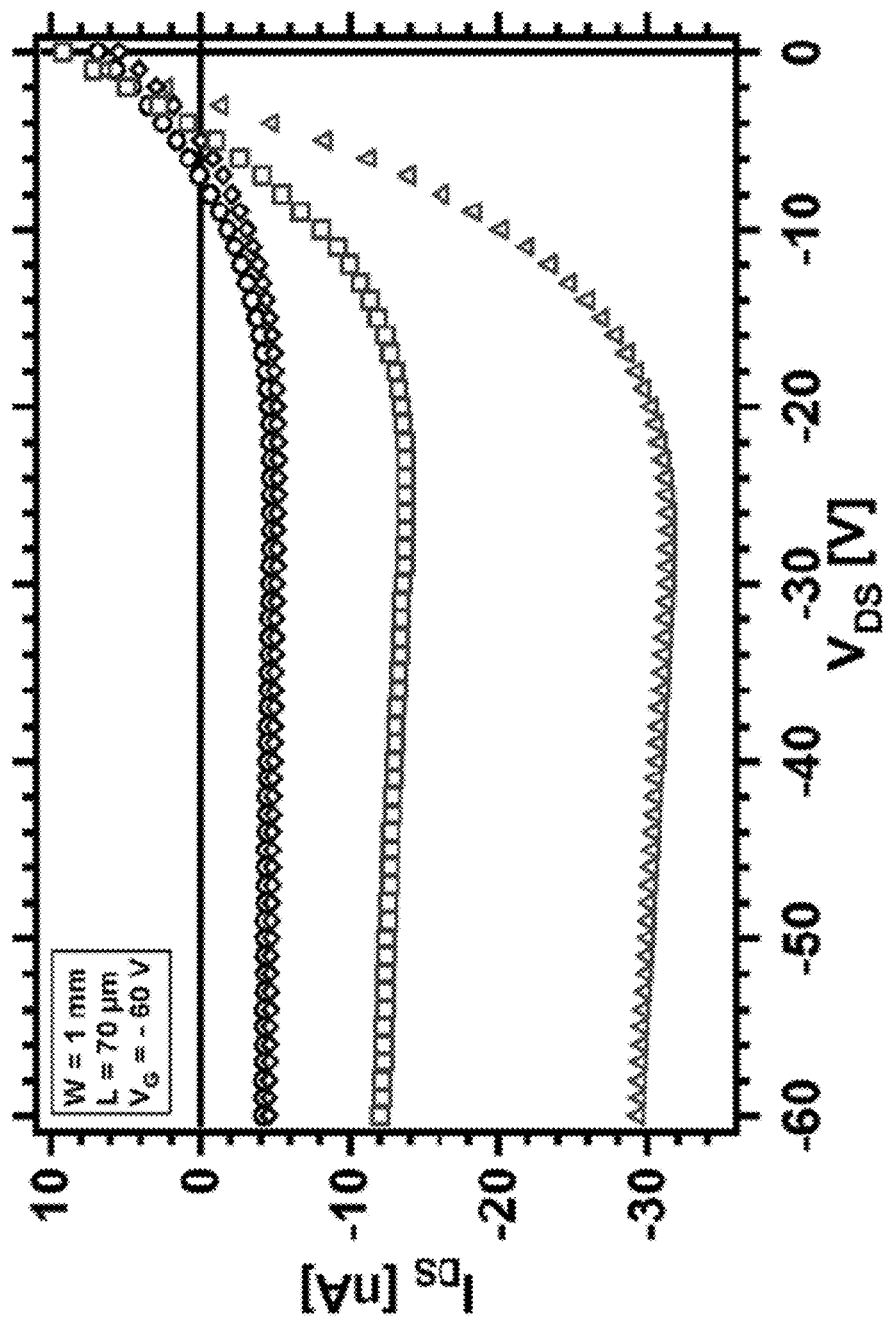
FIG. 5 shows output characteristics of SDT-PT-EH transistors, in the p-type operation regime, that were processed using no additives (circles), 1% v/v DIO (triangles), 1% v/v ODT (diamonds), and 1% v/v CN (squares), wherein $I_{ds}$ in nanoamps (μA) is plotted as a function of drain source voltage $V_{DS}$ in volts (V), and the transistors have channel width W=1 millimeter (mm), channel length L=70 micrometers (μm) and gate voltage $V_G$=−60 volts.

Results and Discussion
   SDT-PT-EH Field Effect Transistors.
   By processing SDT-PT-EH FETs using 1% v/v diiodooctane (DIO) as a processing additive, the saturation hole mobility is $8.7 \times 10^{-4}$ $cm^2/Vs$, a 6.7× enhancement when compared to the control device (no additive) mobility of $1.3 \times 10^{-4}$ $cm^2/$Vs. Other processing additives, like 1% v/v chloronaphthalene (CN) gave a mobility of $3.7 \times 10^{-4}$ $cm^2/Vs$, a 2.8× improvement in saturation mobility, while the addition of 1% v/v octanedithiol (ODT) had a mobility of $1.1 \times 10^{-4}$ $cm^2/Vs$, a 0.8× reduction in hole mobility. Additionally, the use of processing additives reduces the threshold voltage ($V_{Th}$) in all cases. The control device has a $V_{Th}$ of −30 V, while the DIO, CN, and ODT devices have a $V_{Th}$ of −22 V, −27 V, and −24 V respectively. Representative transfer characteristics for these devices are shown in FIG. 4.

The output characteristics of additive processed transistors are also improved. The output current in the saturation regime is enhanced in all cases. For the DIO processed device, which gave the best performance, the output current is enhanced 7× relative to the control device. For CN and ODT processed devices, these improvements are 3× and 1× respectively.

Atomic force microscopy (AFM) was used in order to probe how additive processing influenced the surface topology of the devices. While the surface has a small influence on the transport properties that take place at the polymer-dielectric interface, it can help to give insight into what the additive is doing to the polymer's organization. These data are shown in FIG. 6.

While the surface morphologies appear somewhat similar for all conditions, the surface roughness is not uniform. The control device (FIG. 6a) has a RMS roughness of 0.55 nm. Generally, the additives seemed to significantly increase the surface roughness. The 1% CN device (FIG. 6b) has a roughness of 1.04 nm, the 1% DIO device (FIG. 6c) has a roughness of 2.24 nm, and the 1% ODT device (FIG. 6d) has a roughness of 1.08 nm. These observations seem to indicate that the addition of processing additives have an influence on the bulk organization of the polymer chains, leading to enhanced charge transport properties.

Figure 7:
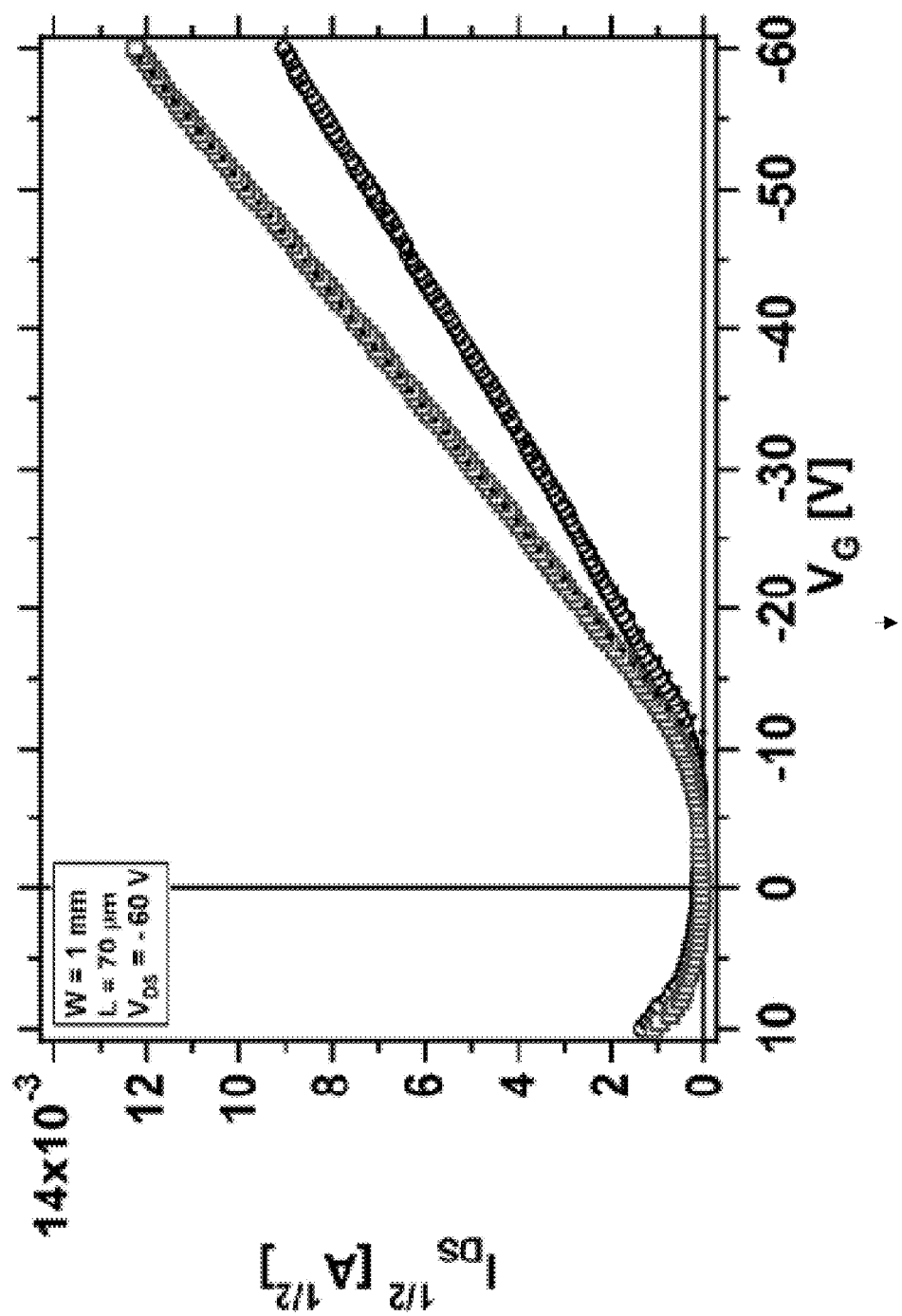
FIG. 7 shows saturation regime p-type transfer characteristics of CDT-PT devices processed without additive (circles) and with additive (squares), wherein dotted lines are fits of Equation 1 to the experimental data, the square root of $I_{ds}$ in A$^{1/2}$ is plotted as a function of gate voltage $V_G$ in volts (V), and the transistors have channel width W=1 millimeter (mm), channel length L=70 micrometers (μm) and drain source $V_{DS}$=−60 volts.

CDT-PT Field-Effect Transistors
   In the same way as the SDT-PT-EH polymers, regioregular CDT-PT polymers were also processed with additives. In these studies, we chose to focus on DIO as a processing additive since it has given the largest enhancement for the CDT-PT polymer. In FIG. 7, the transfer characteristics for additive free and 0.5% v/v DIO processed devices are shown. It is clear that the transfer characteristics are significantly enhanced when the polymer is processed using processing additives. On average, the control devices give a hole mobility of $2.3 \times 10^{-1}$ $cm^2/Vs$, with the best measurement reaching $2.6 \times 10^{-1}$ $cm^2/Vs$. However, the 1% v/v DIO processed device gives an average mobility of $4.0 \times 10^{-1}$ $cm^2/Vs$ with a best value of $4.5 \times 10^{-1}$ $cm^2/Vs$. These improvements lead to a mobility that surpasses previously reported mobilities for this material. In this case, the $V_{Th}$ for both devices are similar, at ~9.7 V. An important indication of an improved polymer-dielectric interface is the improvement of the $I_{on}/I_{off}$ ratio, from $10^4$ to $10^5$, by using additive processing.

As seen with the SDT-PT-EH transistors, the output current is also improved. FIG. 8 shows the output current for a 0.5% DIO processed device and a device without additive. The overall current in the saturation regime is increased by a factor of 1.6.

Figure 9:
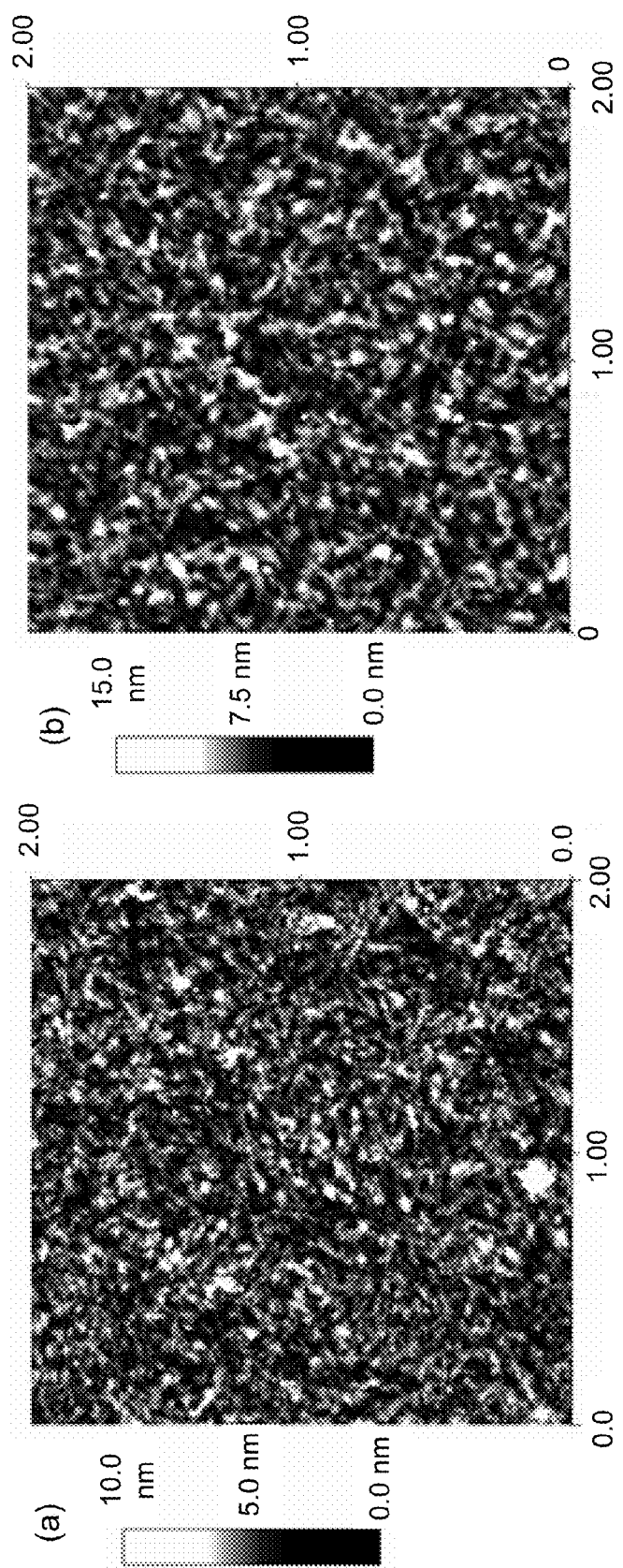
FIG. 9 shows 2×2 μm images showing the surface topology of CDT-PT devices processed without additives (a) and with 0.5% v/v DIO (b) atop OTS-8 treated $SiO_2$ and wherein the images were taken between the source and drain electrodes.

As with the SDT-PT-EH system, AFM was used to see if additive processing had an effect on the surface morphology as well. FIG. 9 shows the surface topology of (a) additive-free and (b) 0.5% v/v DIO processed devices. The surfaces are slight different, and this is quantified in the change in surface roughness. For the device processed with DIO, the RMS roughness is 1.80 nm, while for the additive-free device it is 1.04 nm. This shows that the DIO has a definite effect on how the polymer self-organizes during the film drying process, which in turn has a positive effect on overall device performance.

FIGS. 6(b)-(d) and 9(b) are examples of a composition comprising a processing additive and a conjugated polymer, wherein the composition has improved performance, as a channel region of a Field Effect Transistor (FET), compared to the conjugated polymer processed without the additive.

Figure 11:
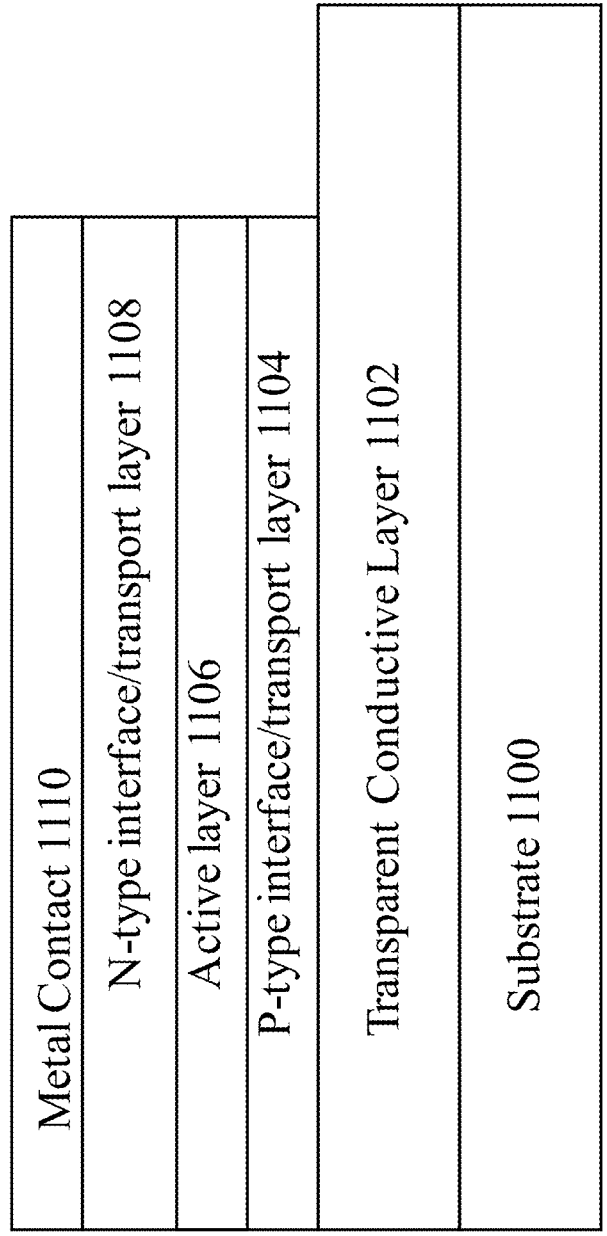
FIG. 11 is a cross-sectional schematic of an organic light emitting diode (OLED) device.

Embodiments of the present invention are not limited to transistor devices. Other devices can also be fabricated. FIGS. 11 and 12 illustrate examples of implementations of the present invention (e.g., fabricated using the method illustrated in FIG. 1) in an Organic Photovoltaic Cell (OPV) and an Organic Light Emitting Diode.

Figure 10:
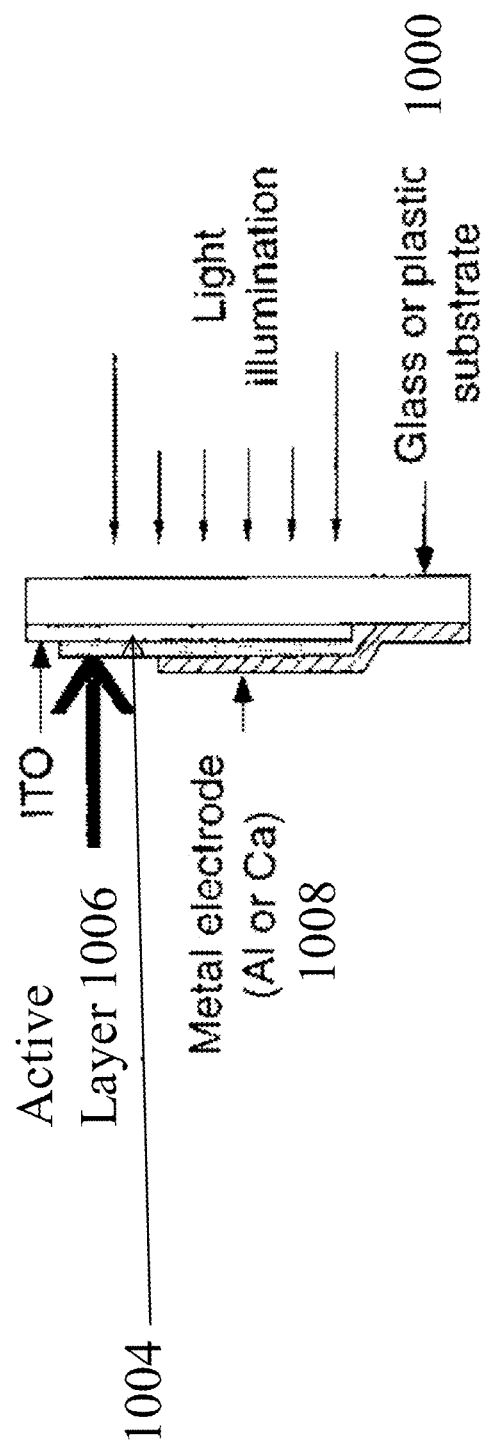
FIG. 10 is a cross-sectional schematic of an organic photovoltaic (OPV) device.

FIG. 10 illustrates a solar cell device or OPV structure according to one or more embodiments, comprising a substrate 1000, a transparent conductive layer 1002 on, above, or overlying the substrate, a p-type interface layer 1004 on, above, or overlying the transparent conductive layer 1002, an active layer 1006 (e.g., film comprising single component polymer processed using a single solvent and a processing additive according to one or more embodiments) on, above, or overlying the p-type interface layer, and a metal contact 1008 on, above, or overlying the active layer 1006.

FIG. 11 illustrates an optoelectronic device, an OLED, comprising an active layer/film comprising single component polymer processed using a single solvent and a processing additive according to one or more embodiments of the present invention. The OLED comprises a substrate 1100, a transparent conductive layer 1102 (e.g., indium tin oxide or ITO) on, above, or overlying the substrate 1100 (e.g., glass, plastic), a p-type hole transport layer 1104 on, above, or overlying the transparent conductive layer 1102, the active or emission layer 1106 comprising a single component polymer processed using a single solvent and a processing additive on, above, or overlying the p-type hole transport layer 1104, an n-type electron transport layer 1108 on, above, or overlying the active layer 1106, and a metal contact 1110 to the n-type transport layer 1108.

Advantages and Improvements

The inventors are the first to disclose processing additives for Organic Light Emitting Diodes (OLEDs), OPVs, or OTFT with a single component polymer or with single component small molecule semiconductors as the active layer. The inventors expect to see similar enhancements in diode structures.

Examples of single component small molecule semiconductors include molecules with a size of 1 nanometer or less or a molecular weight of 800 Daltons or less.

A single component polymer as the active layer is different from a donor/acceptor blend as the active layer (an example of a donor/acceptor blend is a polymer donor and fullerene acceptor).

Moreover, the use of a processing additive as disclosed in the present invention obtains unexpected/unpredicted results. Additives have been used in bulk heterojunction polymer solar cells[9-10]. However, it was hypothesized that additives improved and modified the phase separation of the donor and acceptor components in the bulk heterojunction polymer or donor/acceptor blend, suggesting that for a pristine film or a film processed using a single component polymer and a single solvent as described in one or more embodiments of the present invention, additives would not have the same utility.

In addition, it was not expected that the additives improved the ordering or provided morphological enhancement of the single component polymer films, as illustrated in FIGS. 6 and 9.

REFERENCES

The following references are incorporated by reference herein. Those of skill in the art will appreciate that one or more embodiments of the invention may be adapted for use with methods, materials, or devices known in the art or described in one or more of the following references.

1 (a) H. N. Taso, D. M. Cho, I. Park, M. R. Hansen, A. Mavrinsky, D. Y. Yoon, R. Graft, W. Pisula, H. W. Spiess, K. Müllen, *J. Am. Chem. Soc.*, 2011, 133 (8), 2605-2612. (b) H. Bronstein, Z.-Y. Chen, R. S. Ashraft, W.-M. Min, J.-P. Du, J. R. Durrant, P. S. Tuladhar, K. Song, S. E. Watkins, Y. Geerts, M. M. Wienk, R. A. J. Janssen, T. Anthopoulous, H. Sirringhaus, M. Heeney, I. McCulloch, *J. Am. Chem. Soc.*, 2011, 133 (10), 3272-3275.

2 (a) T. D. Anthopoulous, S. Setayesh, E. Smits, M. Colle, E. Cantatore, B. de Boer, P. W. M. Blom, D. M. de Leeuw, *Adv. Mater.*, 2006, 18, 1900-1904. (b) E. C. P. Smits, T. D. Anthopoulous, S. Setayesh, E. van Veenendaal, R. Coehoorn, P. W. M. Blom, B. De Boer, D. M. de Leeuw, *Phys. Rev. B.*, 2006, 73, 205316-1-205316-9.

3 (a) C. V. Hoven, X.-D. Dang, R. C. Coffin, J. Peet, T.-Q. Nguyen, G. C. Bazan, *Adv. Mater.*, 2010, 22, E63-E66. (b) J. Peet, J. Y. Kim, N. E. Coates, W. L. Ma, D. Moses, A. J. Heeger, G. C. Bazan, *Nature*, 2007, 6, 497-500.

4 (a) H. N. Tsao, D. Cho, J. W. Andreason, A. Rouhanipour, D. W. Breiby, W. Pisula, K. Müllen, *Adv. Mater.*, 2009, 21, 209-212. (b) H. Sirringhaus, *Adv. Mater.*, 2005, 17, 2411-2425.

5. H. Sirringhaus, P. J. Brown, R. H. Friend, M. M. Nielsen, K. Bechgaard, B. M. W. Langeveld-Voss, A. J. H. Spiering, R. A. J. Janssen, E. W. Meijer, P. Herwig, D. M. de Leeuw, *Nature*, 1999, 401, 685-688.

6. Bazan et al. US Patent Publication US2009/0108255.

7. Bazan et al. WO2009/058811.

8. Molecular Self-Assembled Monolayers and Multilayers for Organic and Unconventional Inorganic Thin-Film Transistor Applications, Sara A. DiBenedetto et. al, Adv. Mater. 2009, 21, 1407-1433.

9. Effect of Processing Additive on the Nanomorphology of a Bulk Heterojunction Material, Moon et. al., Nano Lett. 2010, 10, 4005-4008.

10. Improved Performance of Polymer Bulk Heterojunction Solar Cells Through the Reduction of Phase Separation via Solvent Additives, Adv. Mater. 2010, 22, E63-E66 by Hoven et al.

11. Structural Order in Bulk Heterojunction Films Prepared with Solvent Additives, Adv. Mater. 2011, 23, 2284-2288 by Rogers et al.

12. U.S. Pat. No. 7,704,785 by Steiger et al.

13. U.S. Pat. No. 6,994,893 by Spreitzer et al.

14. U.S. Patent Publication No. 2011/0180787 by Cho et al.

15. U.S. Patent Publication No. 2009/0108255 by Bazan et. al, corresponding to U.S. Utility patent application Ser. No. 12/257,069 filed Oct. 23, 2008 and claiming priority to U.S. Provisional Patent Application No. 60/984,229, filed Oct. 31, 2007.

16. Organic Electronics: From Materials to Devices, Yang Yang and Fred Wudl, Adv. Mater. 2009, 21, 1401-1403.

17. Highly Efficient Polymer White-Light-Emitting Diodes Based on Lithium Salts Doped Electron Transporting Layer, Huang et. al., Adv. Mater. 2009, 21, 361.

18. Polymer Photovoltaic Cells: Enhanced Efficiencies via a Network of Internal Donor-Acceptor Heterojunctions, SCIENCE •VOL. 270 •15 Dec. 1995.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating an organic semiconductor device, comprising:
   processing a single component conjugated polymer, in a presence of a processing additive and onto a substrate, wherein:
   the single component conjugated polymer processed onto the substrate is fabricated into an active region of an organic semiconductor device on the substrate;
   the single component conjugated polymer comprises both donor and acceptor repeating units; and
   a carrier mobility in the active region is increased as compared to a carrier mobility in a control active region of a control organic semiconductor device where the single component conjugated polymer is processed without the processing additive.

2. The method of claim 1, wherein the single component conjugated polymer has band gap between 1.7-0.5 electron volts (eV).

3. The method of claim 1, wherein the single component conjugated polymer has a band gap less than 1.7 electron volts (eV). Zone Name: OCRZone 4. The method of claim 1, wherein:
   the device is a field effect transistor (FET),
   the carrier mobility is a hole mobility in a saturation regime (saturation hole mobility), and
   the saturation hole mobility is increased by a factor of least 6, as compared to a saturation hole mobility of no less than $1.3 \times 10^{-4}$ cm$^2$/Vs in a control FET where the single component conjugated polymer is processed without the processing additive.

5. The method of claim 1, wherein:
   the device is a field effect transistor (FET), and the carrier mobility is a hole mobility increased by a factor of at least 1.7, as compared to a control FET's hole mobility of no less than $2.3 \times 10^1$ cm$^2$/Vs in a control FET where the single component conjugated polymer is processed without the processing additive.

6. The method of claim 1, wherein:
   the device is a field effect transistor (FET), and an output current in a saturation regime of the FET is increased by a factor of at least 1.6, compared to an output current in a saturation regime of no less than 22 microamps in a control FET where the single component conjugated polymer is processed without the processing additive.

7. The method of claim 1, wherein:
   the device is a field effect transistor (FET) and
   an on/off (Ion/Ioff) ratio of the FET is increased by a factor of at least ten, compared to an on/off ratio of no less than $10^4$ in a control FET where the single component conjugated polymer is processed without the processing additive.

8. The method of claim 1, wherein:
   the active region has a surface roughness increased by a factor of at least two, as compared to a surface roughness of no more than 0.55 nanometers over an area of 5 micrometers by 5 micrometers in a control active region comprising the single conjugated polymer processed without the processing additive.

9. The method of claim 1, wherein:
   the device is a field effect transistor (FET)$_4$, and
   a threshold voltage magnitude of the FET is reduced, compared to a threshold voltage magnitude of no more than 30 Volts in a control FET where the single component conjugated polymer is processed without the processing additive.

10. The method of claim 1, wherein:
    the processing comprises adding the processing additive to a solution in which the single component conjugated polymer is dissolved;
    the single component conjugated polymer is dissolved in a solvent to form the solution; and
    the processing additive has a higher boiling point than a boiling point of the solvent.

11. The method of claim 1, wherein:
    the processing comprises adding the processing additive to a solution in which the single component conjugated polymer is dissolved;
    the single component conjugated polymer is dissolved in a solvent to form the solution; and
    the single component conjugated polymer has a lower solubility in the processing additive than in the solvent.

12. The method of claim 1, wherein:
    the processing comprises adding the processing additive to a solution in which the single component conjugated polymer is dissolved;
    the single component conjugated polymer is dissolved in a solvent to form the solution; and
    an amount of the processing additive is between 0.01% to 10% wt of additive/wt of the solvent.

13. The method of claim 1, wherein the processing further comprises:
    adding the processing additive to a solution in which the single component conjugated polymer is dissolved;
    depositing the solution, after the additive is added, onto a dielectric layer on the substrate, wherein the solution forms a film on the dielectric layer on the substrate; and
    annealing the film; and further comprising fabricating the annealed film into the active region.

14. The method of claim 1, wherein the single component conjugated polymer is selected from the group consisting of: poly(4-(4,4-bis(2-ethylhexyl)-4H-silolo[3,2-b:4,5-b'] dithiophen-2-yl)-[1,2,5]thiadiazolo[3,4-c]pyridine)(SDT-PT-EH), poly(4-(4,4-dihexadecyl-4H-cyclopenta[1,2-b:5,4-b']dithiophen-2-yl)-[1,2,5]thiadiazolo[3,4-c]pyridine) (CDT-PT), and any of the conjugated polymers disclosed in FIG. 2(b).

15. The method of claim 14, wherein the processing additive is selected from the group consisting of diiodooctane; chloronaphthalene, octanedithiol, 1,6-dithiolhexane; 1,6-dichlorohexane; 1,6-dibromohexane; 1,6-diiodohexane; octadinitrile; 1,8-dithiolooctane; 1,8-dichlorooctane; 1,8-dibromooctane; 1,8-diiodooctane, decanedinitrile; 1,10-dithioldecane; 1,8-dichlorodecane; 1,8-dibromodecane; 1,8-diiododecane; dodecanedinitrile; and chloronaphthalene.

16. The method of claim 1, wherein a lifetime of the device is increased compared to a control device where the single component conjugated polymer is processed without the additive.

17. The method of claim 1, wherein the single component conjugated polymer is a single type of polymer processed in a single solvent.

18. An organic semiconductor device, comprising:
    an active region including a single component conjugated polymer processed using a processing additive and wherein the single component conjugated polymer comprises a regioregular polymer comprising:
both donor and acceptor repeating units;
a main chain section having a repeat unit that comprises a pyridine, and
a carrier mobility in the active region increased as compared to a carrier mobility in a control active region of a control organic semiconductor device where the single component conjugated polymer is processed without the processing additive.

19. The device of claim 18, wherein the device is a solution processed field effect transistor (FET) having:
the carrier mobility comprising a hole mobility in the channel region in a saturation regime of the FET (saturation hole mobility) increased by a factor of least 6, as compared to a saturation hole mobility of no less than $1.3 \times 10^{-4}$ cm$^2$/Vs in a control FET where the single component conjugated polymer is processed without the processing additive; and
the hole mobility in the channel region increased by a factor of at least 1.7, compared to a hole mobility of no less than $2.3 \times 10^1$ cm$^2$/Vs in a control FET where the single component conjugated polymer is processed without the processing additive.

20. The device of claim 18, wherein an amount of processing additive is between 0.01% to 10% wt of additive/wt of solvent used to dissolve the single component conjugated polymer.

21. The device of claim 18, wherein the carrier mobility is a hole mobility increased by a factor of at least 1.7, as compared to a hole mobility of no less than $2.3 \times 10^1$ cm$^2$/Vs in the control active region of the control organic semiconductor device where the single component conjugated polymer is processed without the processing additive.

22. The device of claim 18, wherein the repeat unit further comprises a dithiophene.

23. An organic semiconductor device, comprising:
an active region including a single component conjugated polymer processed using a processing additive, wherein the single component conjugated polymer comprises a regioregular polymer comprising:
both donor and acceptor repeating units, and
a main chain section having a repeat unit that comprises a pyridine, wherein the repeat unit further comprises a dithiophene.

24. The device of claim 23, wherein the pyridine comprises the structure

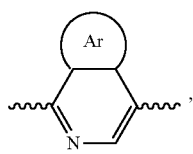

wherein Ar is an aromatic functional group.

25. The device of claim 24, wherein the dithiophene comprises the structure:

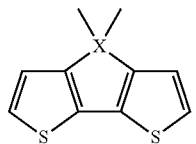

wherein X is an element.

26. The device of claim 25, wherein X is C or Si.

27. The device of claim 23, wherein the pyridine comprises the structure

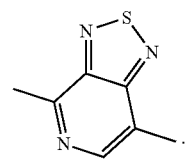

28. A method of fabricating an organic semiconductor device, comprising:
fabricating an active region including processing a single component conjugated polymer using a processing additive, wherein the single component conjugated polymer comprises a regioregular polymer comprising:
both donor and acceptor repeating units, and
a main chain section having a repeat unit that comprises a pyridine, wherein the repeat unit further comprises a dithiophene.

29. The method of claim 28, wherein the pyridine has the structure

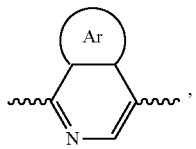

wherein Ar is an aromatic functional group.

30. The method of claim 29, wherein the dithiophene includes the structure:

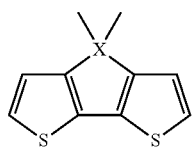

wherein X is an element.

31. The method of claim 30, wherein X is C or Si.

* * * * *

UNITED STATES PATENT AND TRADEMARK OFFICE
CERTIFICATE OF CORRECTION

| | |
|---|---|
| PATENT NO. | : 9,000,423 B2 |
| APPLICATION NO. | : 13/869498 |
| DATED | : April 7, 2015 |
| INVENTOR(S) | : Guillermo C. Bazan et al. |

It is certified that error appears in the above-identified patent and that said Letters Patent is hereby corrected as shown below:

In The Claims

Column 13, line 36:

In claim 3, please delete the words, "Zone Name: OCRZone"

Signed and Sealed this
Fifteenth Day of March, 2016

Michelle K. Lee
*Director of the United States Patent and Trademark Office*